United States Patent
Adams et al.

(10) Patent No.: US 7,035,305 B2
(45) Date of Patent: Apr. 25, 2006

(54) MONOLITHICALLY INTEGRATED HIGH POWER LASER OPTICAL DEVICE

(75) Inventors: David M. Adams, Gloucester (CA); Joan E Haysom, Ottawa (CA); Ian Woods, Gloucester (CA)

(73) Assignee: Bookham Technology, plc, Towcester (GB)

( * ) Notice: Subject to any disclaimer, the term of this patent is extended or adjusted under 35 U.S.C. 154(b) by 91 days.

(21) Appl. No.: 10/141,862

(22) Filed: May 10, 2002

(65) Prior Publication Data

US 2003/0210723 A1 Nov. 13, 2003

(51) Int. Cl.
*H01S 5/00* (2006.01)
*H01S 3/10* (2006.01)

(52) U.S. Cl. .................. 372/50; 372/20; 372/29.021

(58) Field of Classification Search ............. 372/20, 372/29.021, 50; 438/34–37, 45, 46, 511
See application file for complete search history.

(56) References Cited

U.S. PATENT DOCUMENTS

| | | | | |
|---|---|---|---|---|
| 5,395,793 A | * | 3/1995 | Charbonneau et al. | 438/797 |
| 5,708,674 A | * | 1/1998 | Beernink et al. | 372/50 |
| 5,771,256 A | * | 6/1998 | Bhat | 372/45 |
| 5,862,168 A | * | 1/1999 | Schilling et al. | 372/50 |
| 6,027,989 A | * | 2/2000 | Poole et al. | 438/522 |
| 6,233,082 B1 | * | 5/2001 | Johnson | 359/237 |
| 6,349,106 B1 | | 2/2002 | Coldren | |
| 6,483,863 B1 | * | 11/2002 | Forrest et al. | 372/50 |
| 6,503,768 B1 | * | 1/2003 | Cho et al. | 438/21 |
| 6,514,784 B1 | * | 2/2003 | Dubowski | 438/35 |
| 6,574,259 B1 | * | 6/2003 | Fish et al. | 372/50 |
| 6,580,740 B1 | * | 6/2003 | Funabashi et al. | 372/50 |
| 6,611,007 B1 | * | 8/2003 | Thompson et al. | 257/184 |

OTHER PUBLICATIONS

Reithmaier, et al. "Focused Ion–Beam Implantation Induced Thermal Quantum–Well Intermixing for Monolithic Optoelectronic Device Integration", Aug. 1998, IEEE Journal of Selected Topics in Quantum Electronics, vol. 4, No. 4, pp. 595–605.*

Ooi, B.S. et al., "Integration Process for Photonic Integrated Circuits Using Plasma Damage Induced Layer Intermixing," Electronics Letters (Mar. 16, 1995) vol. 31, No. 6, pp. 449–451.

Ramdane, A., et al., "Monolithic Integration of InGaAsP–InP Strained–layer Distributed Feedback Laser and External Modulator by Selective Quantum–Well Interdiffusion," IEEE Photonics Technology Letters 7(1995) Sep., No. 9, pp. 1016–1018.

* cited by examiner

*Primary Examiner*—David Porta
*Assistant Examiner*—Davienne Monbleau
(74) *Attorney, Agent, or Firm*—Lahive & Cockfield, LLP; Anthony A. Laurentano, Esq.

(57) ABSTRACT

An optical device, including a monolithically integrated diode laser and semiconductor optical amplifier, that has reduced linewidth and improved side mode suppression for a given output power target. In a preferred embodiment, the diode laser is detuned from a gain peak wavelength to an emission wavelength. The semiconductor optical amplifier has an active region that is bandgap shifted to move its gain peak towards the emission wavelength of the laser diode, thus reducing its linewidth enhancement factor. The diode laser is preferably either a gain-coupled or index-coupled distributed feedback laser. The bandgap shift can be effected by known bandgap shifting methods, such as ion implantation, dielectric cap disordering, and laser induced disordering.

18 Claims, 5 Drawing Sheets

MONOLITHICALLY INTEGRATED HIGH POWER LASER OPTICAL DEVICE

FIELD OF THE INVENTION

The present invention relates generally to monolithically integrated optical devices and their methods of fabrication. More particularly, the present invention relates to a semiconductor optical amplifier (SOA) monolithically integrated with a diode laser, such as a distributed feedback (DFB) laser.

BACKGROUND OF THE INVENTION

DFB lasers have a diffraction grating etched along the length of the gain medium to form optical resonance cavities at desired wavelengths. Commonly available DFB lasers are made of layered indium phosphide or gallium arsenide compounds, and include a multi-quantum well active layer, or region, that is pumped to emit light at the wavelength determined by a diffraction grating in proximity to the active region. In high-speed optical communication systems, common DFB lasers typically operate in the 1310 nm or 1550 nm regions of the infrared spectrum.

In operation, DFB lasers are often combined with SOAs in order to amplify the optical output power. Monolithic integration, where the various components are grown on a single chip, is one way in which to combine them. It is desirable in a monolithically integrated DFB laser and SOA to have a high operational optical output power, in conjunction with a high side mode suppression ratio (SMSR) and narrow laser linewidth.

In a monolithically integrated DFB laser and SOA device, the optical amplifier section and the laser section may use the same active region design, except that the optical amplifier has no grating. By appropriate choice of the diffraction grating pitch, it is possible to adjust the laser linewidth by "detuning" the distributed feedback emission wavelength of the laser section from the material peak gain wavelength to an emission wavelength. Generally, the linewidth is decreased when selecting an emission wavelength situated on the short wavelength side of the gain peak wavelength. Because of this detuning, the laser now emits at a wavelength well removed from the gain peak (in the range of up to ~30 nm from the gain peak wavelength). But, while it is possible to achieve a reduced linewidth by detuning the laser in this manner, because the laser and SOA share the same gain medium, the gain peak of the optical amplifier and emission wavelength of the laser no longer coincide. The latter effect compromises the peak optical output power and SMSR of the combined DFB laser and SOA.

It has also been found that minute back-reflections from the SOA output facet cause an unacceptable broadening of the laser linewidth. Techniques can be applied that reduce the optical reflections from the output of the SOA, thereby reducing the impact of facet reflections on the laser linewidth. These include: using an output waveguide that is angled relative to the plane of the output facet; using an anti-reflection coating at the output facet; using a flared waveguide; using a window region; and using a spot-size converter to increase the size of the optical mode at the output. More than one of these methods can be used in combination when attempting to minimize the reflectivity of the SOA output facet. However, it has been found that reflectivity reduction is not sufficient to maintain an adequately narrow linewidth, unless it is combined with substantial detuning, which, as stated above, is what limits the output power.

Attempts to attain greater output power by lengthening the SOA result in even greater degradation of the SMSR and the linewidth of the integrated device for two reasons. First, the SMSR of the combined laser and amplifier declines because there is a larger accumulation of spontaneous emission within the optical amplifier section, and second, the longer optical amplifier section allows for more amplification of the back-reflections, which then further degrade the linewidth of the laser. Even without amplification, the increased length of this second device results in a degradation of the laser linewidth because the larger volume stores more energy per round-trip, leading to increased laser instability.

It is, therefore, desirable to provide a monolithically integrated DFB laser and SOA optical device that has high power output, strong side mode suppression and adequately narrow linewidth, by using an efficient SOA that is as short as possible for a given output power performance target.

SUMMARY OF THE INVENTION

It is an object of the present invention to obviate or mitigate at least one disadvantage of previous monolithically integrated optical devices. In particular, it is an object of the present invention to provide a monolithically integrated diode laser and semiconductor optical amplifier that has reduced linewidth and improved side mode suppression for a given output power target.

In a first aspect, the present invention provides an optical device that comprises a diode laser section, preferably detuned from a gain peak wavelength to an emission wavelength. A semiconductor optical amplifier section is monolithically integrated with the laser section. The SOA section has an active region gain peak wavelength which is substantially aligned with the emission wavelength of the laser, thus allowing for a shorter SOA that still provides the required power amplification. The substantial alignment of the gain peak positions of the DFB laser and SOA sections of the device is accomplished by bandgap shifting one of the sections. This minimizes the linewidth penalty for a given SOA output facet reflectivity, and minimizes the degradation of the SMSR due to the accumulation of spontaneous emission in the SOA. The laser section is preferably either a gain-coupled or index-coupled distributed feedback laser.

In further aspects of the present invention, there are provided a method and apparatus for fabricating the above-described optical device. The method comprises bandgap shifting, using suitable means and techniques for bandgap shifting, either the active region of the SOA section to move its gain peak towards the emission wavelength of the laser section, or the active region of the laser section to move its gain peak away from the emission wavelength. Either implementation will minimize the linewidth and SMSR at the output of the integrated laser and amplifier. The bandgap shifting can be effected by such techniques as ion implantation, dielectric cap disordering, and laser induced disordering.

In further embodiments of the device of the present invention, the optical device is a tunable laser matrix or array comprising a plurality of diode lasers monolithically integrated with one common SOA, or monolithically integrated with a plurality of SOAs. The active regions of one or more of the SOAs can be bandgap shifted towards the emission wavelength of its respective laser section. It is also contemplated that portions of an SOA section can be differentially bandgap shifted.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1:
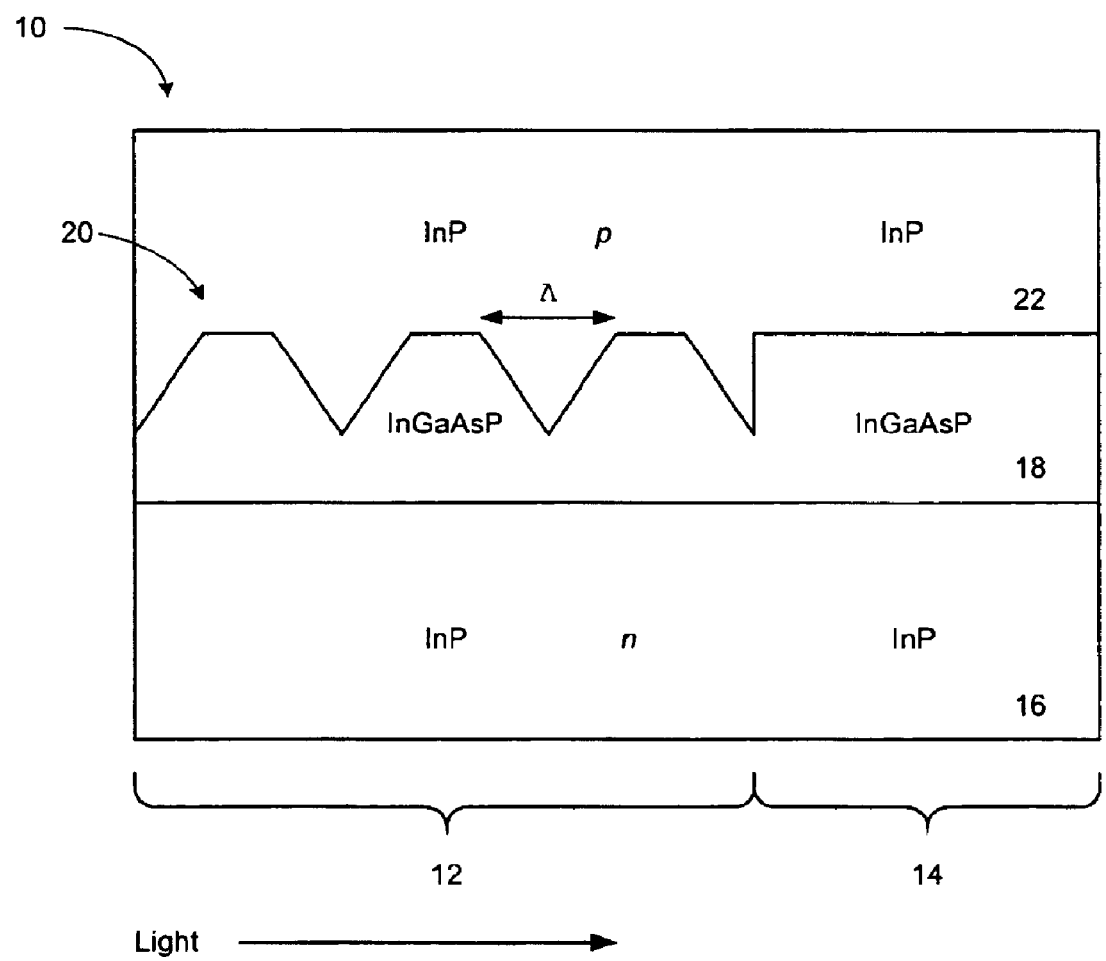
FIG. 1 is a schematic of a longitudinal cross-section of a monolithically integrated DFB laser and SOA.

Generally, the present invention provides a monolithically integrated optical device, and method of fabrication, for increasing the attainable output power for a fixed SMSR and linewidth target. In essence, the invention consists of either shifting the gain peak of the SOA section in the short wavelength direction (blueshifting) or shifting the gain peak of the DFB section in the long wavelength direction (redshifting), such that the gain peak of the SOA section is substantially aligned to the emission wavelength while the gain peak of the DFB section is detuned to the long-wavelength side of the emission wavelength. The invention is particularly applicable to high power lasers that consist of a separately contacted index or gain-coupled distributed feedback laser source section, in combination with a monolithically integrated optical amplifier section to boost the output power.

The invention takes advantage of the relationship between linewidth and the linewidth enhancement factor of the gain medium. For example, the equation for the linewidth of a DFB laser source section with an attached SOA section is given by:

$$\Delta v = \frac{\Delta v_0}{(1 + C\cos(\phi + \tan^{-1}\alpha_H))^2}$$

where $\Delta v_0$ is the linewidth in the absence of the optical amplifier section, $\alpha_H$ is the linewidth enhancement factor of the laser section (substantially defined by the active region design), $\phi$ is the round trip phase delay in the optical amplifier section, and C is a quantity that is proportional to the linewidth enhancement factor, amplifier length, and the amplifier facet effective reflectivity, as given by:

$$C = \frac{\tau_{SOA}}{\tau_{laser}} \cdot \frac{r_{SOA}}{r_{laser}} \cdot (1 - |r_{laser}|^2) \cdot \sqrt{1 + \alpha_H^2}$$

where $\tau_{SOA}$ and $\tau_{laser}$ are the length of the SOA and laser source sections, respectively, and where $r_{SOA}$ and $r_{laser}$ are the effective reflectivities of the SOA facet and laser facet, respectively, where effective reflective reflectivity of the SOA is gain squared times the actual SOA facet reflectivity $r_{SOA\text{-}facet}$. To minimize the linewidth, $\Delta v$, C must be made as small as possible. This can be accomplished by minimizing the linewidth enhancement factor, $\alpha_H$, keeping the SOA length, $\tau_{SOA}$, as short as possible, and/or having a SOA facet reflectivity, $r_{SOA\text{-}facet}$, as small as possible.

It is well known that the linewidth enhancement factor can be minimized by designing the active region to have maximum differential gain near the laser threshold gain condition. This can be done, for example, by manipulating the number of quantum wells, the optical confinement layers and/or the doping. In the present invention, the linewidth of the monolithically integrated DFB and SOA is further reduced by incurring a shift of the bandgap of the SOA section active region relative to the bandgap of the DFB section active region. The intent is to shift the SOA gain peak wavelength toward, or ideally to substantially align with, the distributed feedback emission wavelength, or lasing wavelength, which remains detuned to the short wavelength side of the gain peak in the laser source section in order to maintain a small $\alpha_H$. Substantial alignment, as used herein, is alignment within acceptable error tolerances due to processing variability, and will depend on the method chosen to effect the bandgap shifting.

Additionally, by bandgap shifting the SOA gain peak to be substantially aligned with the lasing wavelength, the SOA will have better gain per unit length, and thus one may employ a shorter SOA (for a given output power requirement), which will also result in a reduced linewidth.

Ideally, a bandgap shifting technique that ultimately results in a relative shift of the SOA active region gain peak wavelength relative to the laser source section gain peak wavelength of approximately 30 nm, in the case of 1310 nm and 1550 nm DFB lasers, is desired. The chosen bandgap shifting technique should maintain substantial detuning of the output emission wavelength in the DFB laser source section, preferably on the short wavelength side of the gain peak. This maximizes the resilience to linewidth broadening. The chosen bandgap shifting techniques should also ultimately result in the SOA gain peak position being shifted toward the emission wavelength of the DFB laser source section. Some techniques may shift the gain peak in the DFB laser source section, while more rapidly shifting the gain peak in the SOA section to the short wavelength side. This also results in the desired relative shift of the SOA gain peak relative to the DFB laser source section's gain peak position.

Alternately, the bandgap shifting can be applied to the laser section to shift the gain peak in the long wavelength direction. In this case, the starting active region peak gain is not detuned from the emission wavelength. The act of shifting the laser section to the long wavelength side of the emission wavelength results in a DFB section that is detuned from the emission wavelength, while the gain peak of the SOA section remains well aligned to the emission wavelength.

Generally, bandgap shifting of quantum well heterostructures is accomplished by intentionally causing interdiffusion between atoms in the quantum well region and atoms in the barriers surrounding the quantum well region. This interdiffusion alters the compositional profile of the quantum well region, which changes the quantum confinement potential, and which subsequently changes the transition energies of the structure, including the gain peak. Bandgap shifting is also referred to as quantum well intermixing, or layer disordering, or quantum well interdiffusion. Bandgap shifting can be accomplished by several different processing techniques. A few suitable methods will be described here, and are discussed in greater detail in S. F Yu and E. H. Li, "Semiconductor Lasers Using Diffused Quantum-Well Structures", IEEE J. Selected Topics in Quantum Electronics, vol. 4, no. 4, pp. 723–735, 1998.

In dielectric cap disordering, the presence of a dielectric layer on the semiconductor surface during a high temperature anneal enhances the interdiffusion of underlying quantum wells. By patterning this dielectric layer, one can bandgap shift selected regions of the wafer. Regions where no bandgap shift is desired are either left uncapped, or covered with a different dielectric that does not induce shifting. This particular technique is also referred to as impurity-free vacancy disordering (see e.g. "Improvements in Mode-Locked Semiconductor Diode Lasers Using Monolithically Integrated Passive Waveguides Made by Quantum-Well Intermixing", IEEE Photon. Technol. Lett. vol. 9, no. 9, pp. 1208–1210, 1997).

In another bandgap shifting method, implantation of ions into the semiconductor crystal can be used to create lattice defects, which can then enhance interdiffusion during a subsequent high temperature anneal. The ion species used can be divided into two major categories: electrically active impurities (dopants), and neutral species. For the electrically active impurities, the change in the Fermi level energy biases certain native defect reactions, which then generate a surplus of point defects (impurities can also be introduced by diffusion). When implanting neutral species, the point defects created by the recoil cascades of the implant process are relied upon to enhance the intermixing (see e.g. S. Charbonneau, Emil S. Koteles, P. J. Poole, J. J He, G. C. Aers, J. Haysom, M. Buchanan, Y. Feng, A. Delage, F. Yang, M. Davies, R. D. Golberg, P. G. Piva, and I. V. Mitchell, Photonic Integrated Circuits Fabricated Using Ion Implantation, IEEE J. Selec. Topics Quantum Electron. 4, 772, 1998). The depth to which the ions are implanted can be above, into, or through the quantum wells depending on the nature of the implant species and target heterostructure. Surface damage due to very low energy ions or plasmas can also be used (see e.g. S. D. McDougall, O. P. Kowalski, C. J. Hamilton, F. Camacho, B. Qiu, M. Ke, R. M. De La Rue, A. C. Bryce, J. H. Marsh, Monolithic Integration via a Universal Damage Enhanced Quantum-Well Intermixing Technique, IEEE J. Selec. Topics Quantum Electron. 4, 636, 1998).

In laser induced disordering a laser beam is used to directly heat selected regions of the wafer. Wherever the temperature is raised sufficiently, interdiffusion will occur (see e.g. A. McKee, G. Lullo, C. J. McLean, A. C. Bryce, R. M. De La Rue, and J. H. March, Proc. SPIE 2401, 44, 1995; J. J. Dubowski, G. Marshall, Y. Feng, P. J. Poole, C. Lacelle, J. E. Haysom, S. Charbonneau and M. Buchanan, Proc. SPIE 3618, 1999). This technique requires direct writing of the laser across the wafer.

This is a partial list of the many bandgap shifting techniques available, and is not intended to limit, in any way, the scope of the present invention, which is defined solely by the claims appended hereto. The actual technique chosen will depend on the application, the composition of the optical device, and other design factors and manufacturing limitations, as are well known to those of skill in the art. The use of other suitable bandgap shifting techniques is fully contemplated and encompassed by the present invention.

Figure 2:
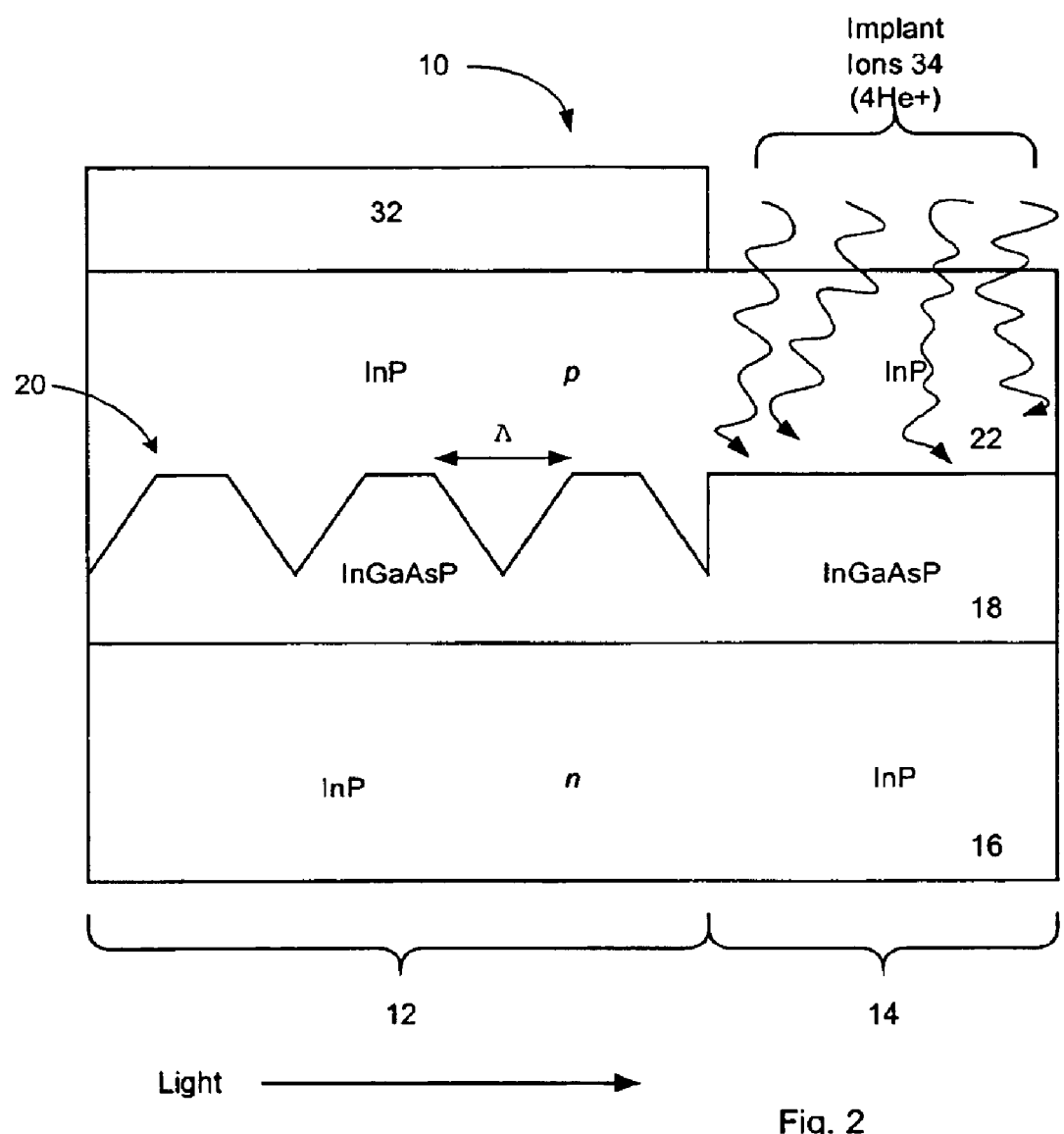
FIG. 2 is a schematic of a the optical device of FIG. 1 undergoing ion implantation.
Figure 3:
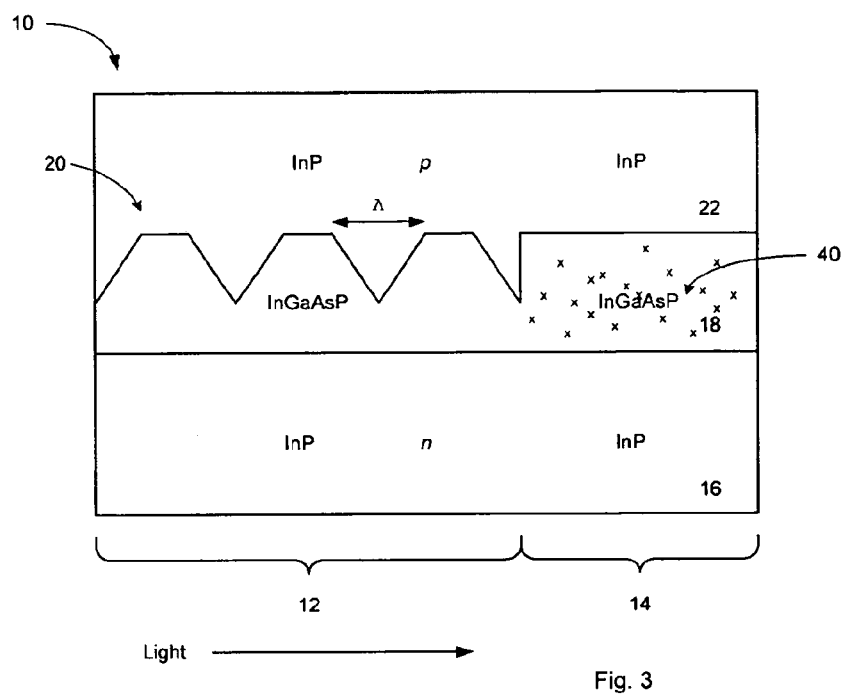
FIG. 3 is a schematic of the optical device of FIG. 2, after an annealing step.

FIGS. 1 to 3 show successive steps in the application of the method of the present invention to an integrated InGaAsP diode laser section and semiconductor optical amplifier section, using ion implantation to shift the gain peak wavelength of the SOA. Shifting the laser section to substantially align its gain peak wavelength to the emission wavelength of the SOA section can be achieved in the same manner. This is an exemplary embodiment only, and is not intended to limit the scope of the present invention in any way. FIGS. 1 to 3 are simplified schematics, and are not to scale. Metallization, and other non-semiconductive layers, are not shown.

FIG. 1 is a longitudinal cross section, in the direction of light propagation, of a conventional InGaAsP integrated source laser and semiconductor optical amplifier 10, prior to bandgap shifting the SOA section according to the present invention. Device 10 consists of a laser section 12 and a semiconductor amplifier section 14. Device 10 is fabricated in a conventional manner, by successive growth, masking, and etching steps, as is well known to those of skill in the art. An n-doped InP layer 16 is first deposited, followed by epitaxial growth of an InGaAsP gain medium layer 18. The InGaAsP gain medium layer 18 includes a quantum well active region. A diffraction grating 20, having pitch Λ, is etched into the laser section 12, followed by growth of a p-doped InP layer 22.

In a presently preferred embodiment, ion implantation of neutral species to depths above the quantum wells is used. This step is shown in FIG. 2. In a specific implementation, 4He+ ion implantation is applied after the second epitaxial growth of the p-doped layer 22. First, a thick dielectric masking layer 32 is deposited and patterned. Dielectric layer 32 serves to block ions in regions of the wafer where no bandgap shifting is desired, with open windows over the portions of the wafer that will become semiconductor optical amplifier devices. The presence of a thin amorphous dielectric layer in the open windows can also be used to prevent channeling of the ions along crystallographic directions and maintain control of implant depth. These steps are followed by ion implantation of 4He+ ions 34 with energy in the range of 200 keV, such that the projected end-of-range damage due to the implant is in the order of one micron. The energy is chosen such that this end-of-range is less than the distance between the quantum wells and the semiconductor surface (i.e. damage is created above the quantum wells). The implant dose is adjusted to achieve the desired bandgap shift.

After suitable implantation, the dielectric layer(s) 32 are removed by wet chemical etching, and the wafer is annealed at a temperature in the range of the 700° C. for a time sufficient to achieve a saturation of the bandgap shift. During this anneal, the implantation damage releases point defects which diffuse through the quantum wells and enhance their interdiffusion, while the 4He$^+$ ions diffuse out of the material and release He$_2$ gas. The implanted regions 40 are bandgap shifted 20 to 100 nm, depending on the implant dose, energy, and quantum well structure. At this point the bandgap shifting processing steps are complete, and the wafer can then be passed on for remaining device processing.

Figure 4A:
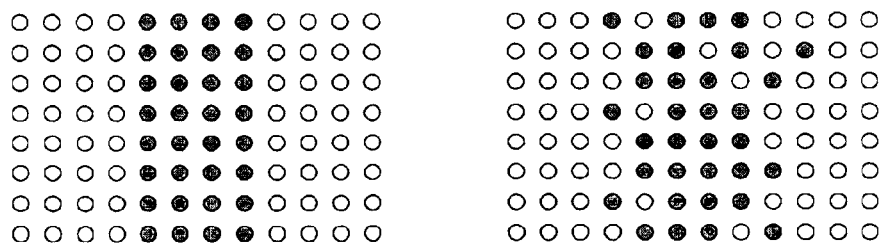
FIGS. 4a and 4b show the intermixing of atoms in the barrier material and in the quantum well region during ion implantation, and the resultant changes in the semiconductor's energy bands, respectively.
Figure 4B:
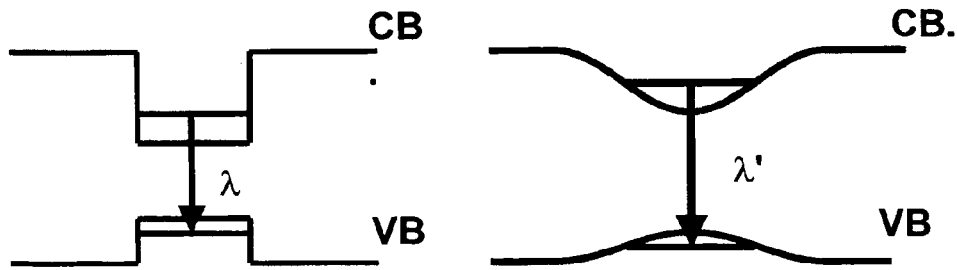

FIG. 4a shows, in a simplified schematic form, how the atoms of the quantum well region, represented by the solid circles, intermix with the atoms of the barrier material (white circles) following the annealing step of the quantum well implantation method. As shown in FIG. 4b, this results in changes to the semiconductor's electronic energy bands, where CB is the conduction band and VB is the valence band. Preferably, the anneal temperature should be chosen to cause minimal intermixing in masked regions and a high levels of intermixing in the implanted regions.

In an alternative embodiment, bandgap shifting can be applied after the first epitaxial growth, which includes growth of the quantum well active region 18, as well as additional semiconductor material, such as an InP buffer layer, above the quantum wells. This additional buffer layer is sacrificial, to be implanted into during the quantum well implantation and then removed prior to standard second epitaxial growth. The same quantum well processing steps as described above are applied to this modified first epitaxial growth, including dielectric mask deposition and patterning, implantation, dielectric strip, and annealing. Following annealing, the sacrificial InP buffer layer is removed by selective wet etch, and processing of the grating patches in the laser sections is performed. Second epitaxial growth and standard device processing follow.

Figure 5:
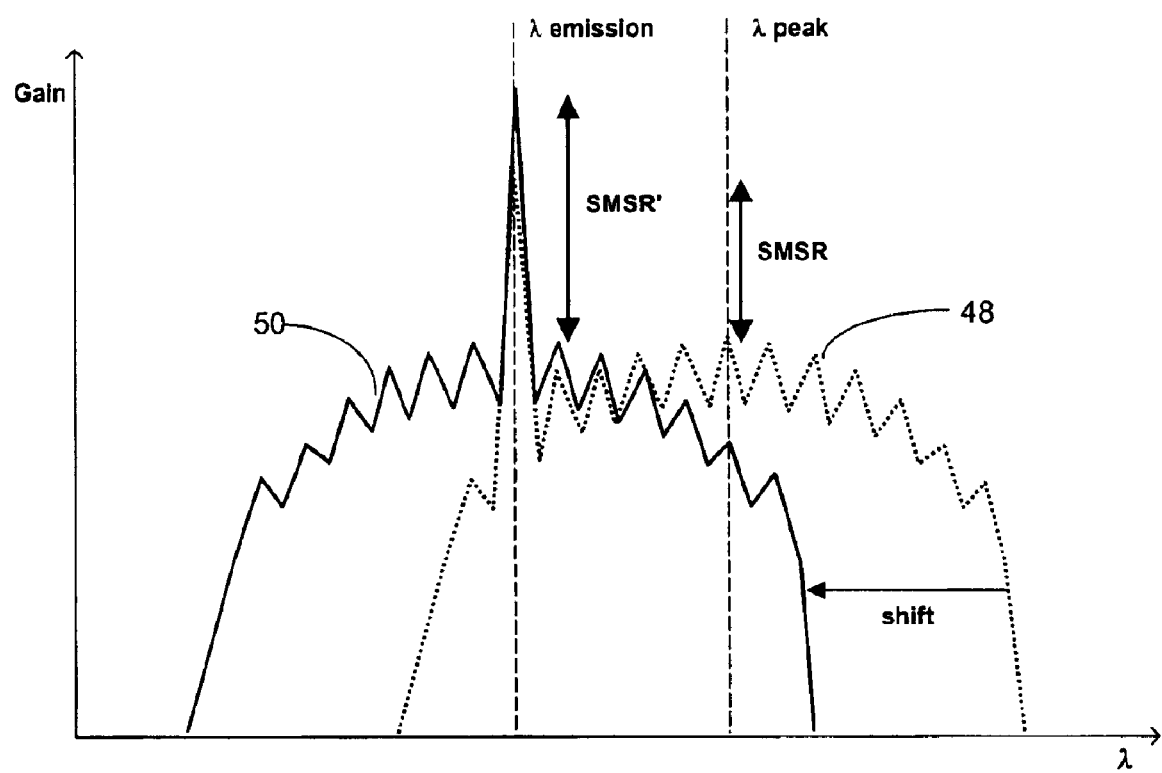
FIG. 5 is a graphical representation of the shift in the gain peak of the SOA.

The present invention enables simultaneous achievement of high output power while retaining a low laser linewidth, thereby enhancing long distance optical fiber based telecommunications. Regardless of the method chosen to effect the desired bandgap shift, the resulting change to the amplifier gain peak results in an overall reduced linewidth for the DFB laser when combined with the optical amplifier. The optical device of the present invention also improves the SMSR for a fixed power target. This advantage can be best understood by reference to FIG. 5. Gain profile 48 represents the gain as a function of wavelength for the distributed feedback laser and the optical amplifier prior to bandgap shifting. The peak wavelength $\lambda_{peak}$, and the emission wavelength $\lambda_{emission}$ to which the laser is detuned, are shown. Also shown is the gain profile 50 for the semiconductor optical amplifier after bandgap shifting. Clearly, side modes are more strongly suppressed after bandgap shifting. The electrical-to-optical conversion efficiency of the device is also improved, which reduces the size of the SOA for a fixed power target. As a further benefit, the reduction in size of the SOA also reduces the chip thermal dissipation and chip size for a fixed power target.

The previous discussion has focussed on a single laser integrated with a single semiconductor optical amplifier. However, the present invention can also be applied to multiple lasers integrated with one or more SOAs, and to single lasers integrated with multiple SOAs. It is also fully within the contemplation of the present invention that diode lasers can be integrated with other optical components, such as combiners. The other optical components can be bandgap shifted to reduce linewidth and improve SMSR at the output of the integrated device in the same manner as described for an SOA.

Figure 6:
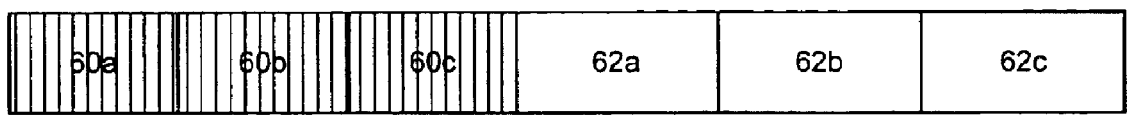
FIG. 6 is laser array according to the present invention.

For example, FIG. 6 shows a monolithically integrated cascaded array of lasers, each operating at a different emission wavelength. In the illustrated three laser array, each laser 60a, 60b and 60c has a respective semiconductor optical amplifier 62a, 62b, 62c. The bandgap of one or more of the SOAs can be separately shifted to correspond to the detuning of its respective laser. Or alternately the bandgap of one or more of the lasers can be separately reshifted to approximately detune each laser's gain peak from the emission wavelength. This may involve, for example, multiple steps of masking and ion implantation, prior to annealing.

Figure 7:
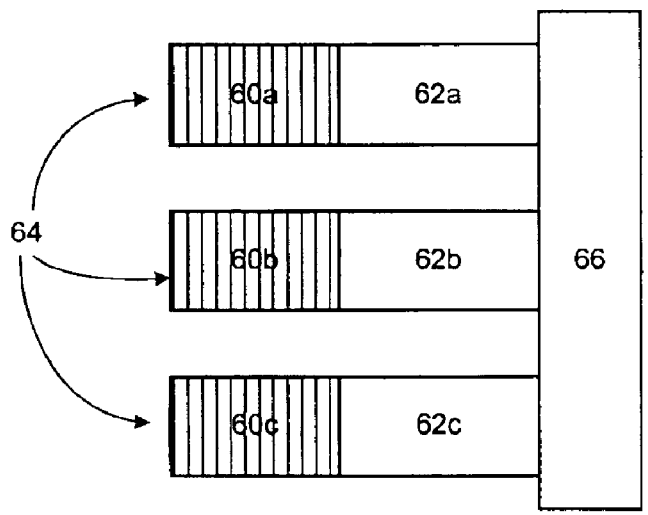
FIG. 7 is a tunable laser matrix configuration according to the present invention.

Similarly, in a tunable laser matrix having multiple arms 64 feeding into a combiner 66, as shown in FIG. 7, a bandgap shift can be effected in the semiconductor optical amplifier 62 in any arm 64, or in the combiner 66, to reduce the linewidth broadening and improve the side mode suppression. Again, this involves partial, or selective, interdiffusion of the active regions of one or more of the devices.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. An integrated optical device, comprising: a diode laser section; and a semiconductor optical amplifier section monolithically integrated with the laser section, one of the laser section and the semiconductor optical amplifier section having an active region that is bandgap shifted such that the gain peak wavelength of the semiconductor optical amplifier section is substantially aligned with an emission wavelength of the integrated optical device, and the gain peak wavelength of the laser section is detuned.

2. The integrated optical device of claim 1, wherein the emission wavelength is a detuned gain peak wavelength of the diode laser section.

3. The integrated optical device of claim 1, wherein the laser section is a distributed feedback laser.

4. The integrated optical device of claim 3, wherein the distributed feedback laser is a gain-coupled distributed feedback laser.

5. The integrated optical device of claim 3, wherein the distributed feedback laser is a index-coupled distributed feedback laser.

6. The integrated optical device of claim 1, wherein the device is fabricated on an InP wafer.

7. The integrated optical device of claim 6, wherein the active region is InGaAsP.

8. The integrated optical device of claim 1, wherein the laser section is one of a plurality of diode laser sections having at least one semiconductor optical amplifier section monolithically integrated therewith.

9. The integrated optical device of claim 8, wherein the plurality of lasers and the at least one semiconductor optical amplifier form a tunable laser.

10. The integrated optical device of claim 8, wherein each of the at least one semiconductor optical amplifier sections has an active region that is bandgap shifted to shift its gain peak towards the emission wavelength of its respective laser section.

11. The integrated optical device of claim 1, wherein the laser section is one of a plurality of diode laser sections, the output of each of the plurality of lasers being combined and amplified by a common semiconductor optical amplifier section monolithically integrated therewith.

12. The integrated optical device of claim 11, wherein the plurality of laser sections and the common semiconductor optical amplifier section form a tunable laser.

13. The integrated optical device of claim 1, wherein portions of the semiconductor optical amplifier section are differentially bandgap shifted.

14. A method of fabricating an integrated optical device, the integrated optical device having a diode laser section monolithically integrated with a semiconductor optical amplifier section, comprising: bandgap shifting an active region of one of the laser section and the semiconductor optical amplifier section such that the gain peak wavelength of the semiconductor optical amplifier section is substantially aligned with an emission wavelength of the integrated optical device, and the gain peak wavelength of the laser section is detuned.

15. The method of claim 14, wherein the step of bandgap shifting includes ion implantation.

16. The method of claim 14, wherein the step of bandgap shifting includes dielectric cap disordering.

17. The method of claim 14, wherein the step of bandgap shifting includes laser induced disordering.

18. The method of claim 14, wherein the step of bandgap shifting includes impurity induced disordering.

* * * * *